United States Patent
Li et al.

(10) Patent No.: US 12,113,388 B2
(45) Date of Patent: Oct. 8, 2024

(54) CHARGING CONTROL METHOD AND APPARATUS, BATTERY MANAGEMENT SYSTEM AND READABLE STORAGE MEDIUM

(71) Applicant: CONTEMPORARY AMPEREX TECHNOLOGY (HONG KONG) LIMITED, Hong Kong (CN)

(72) Inventors: Zhanliang Li, Fujian (CN); Yu Yan, Fujian (CN); Zhimin Dan, Fujian (CN); Shuyun Xiong, Fujian (CN); Weiping Sun, Fujian (CN); Xiyang Zuo, Fujian (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 467 days.

(21) Appl. No.: 17/561,239

(22) Filed: Dec. 23, 2021

(65) Prior Publication Data
US 2022/0407338 A1 Dec. 22, 2022

Related U.S. Application Data

(63) Continuation of application No. PCT/CN2021/100724, filed on Jun. 17, 2021.

(51) Int. Cl.
*H02J 7/00* (2006.01)
*G01R 31/382* (2019.01)
(Continued)

(52) U.S. Cl.
CPC ........ *H02J 7/00711* (2020.01); *G01R 31/382* (2019.01); *H02J 7/0048* (2020.01);
(Continued)

(58) Field of Classification Search
CPC .... H02J 7/00711; H02J 7/0048; H02J 7/0069; H02J 7/007182; H02J 7/007192; H02J 7/007194; G01R 31/382
(Continued)

(56) References Cited

U.S. PATENT DOCUMENTS 5,548,200 A * 8/1996 Nor .................. B60L 53/11
320/132
5,726,551 A * 3/1998 Miyazaki ............ B60L 53/57
320/155
(Continued)

FOREIGN PATENT DOCUMENTS

CN 103825060 B * 6/2016 .......... H01M 10/443
CN 104064836 B 7/2016
(Continued)

OTHER PUBLICATIONS

Extended European Search Report dated Dec. 5, 2022 received in European Patent Application No. EP 21819319.1.
(Continued)

*Primary Examiner* — John T Trischler
(74) *Attorney, Agent, or Firm* — Scully, Scott, Murphy & Presser, P.C.

(57) ABSTRACT

The present application provides a charging control method and apparatus, a battery management system and a readable storage medium. The charging control method includes: obtaining a battery temperature and a battery state of charge; determining a pulse charging frequency according to the battery temperature, the battery state of charge and a pre-calibrated corresponding relationship; obtaining a preset waveform characteristic of a pulse charging waveform; where the waveform characteristic includes a ratio range of an area of a positive pulse waveform to an area of a negative pulse waveform in each pulse cycle of the pulse charging waveform; and generating a charging request according to
(Continued)

the pulse charging frequency and the waveform characteristic and transmitting the charging request to a charging device. The method is used for improving charging stability and safety of a battery.

18 Claims, 3 Drawing Sheets

(51) Int. Cl.
*H01M 10/44* (2006.01)
*H01M 10/48* (2006.01)

(52) U.S. Cl.
CPC ...... *H02J 7/0069* (2020.01); *H02J 7/007182* (2020.01); *H02J 7/007192* (2020.01); *H02J 7/007194* (2020.01); *H01M 10/443* (2013.01); *H01M 10/446* (2013.01); *H01M 10/486* (2013.01); *H02J 7/0071* (2020.01)

(58) Field of Classification Search
USPC .......................................................... 320/139
See application file for complete search history.

(56) References Cited

U.S. PATENT DOCUMENTS

| | | | | |
|---|---|---|---|---|
| 5,773,955 | A * | 6/1998 | Hall | H02J 7/00711 320/108 |
| 5,994,872 | A * | 11/1999 | Hall | H02J 7/02 320/108 |
| 6,441,588 | B1 * | 8/2002 | Yagi | B60L 58/27 320/150 |
| 7,933,086 | B2 * | 4/2011 | Okita | G11B 19/02 360/51 |
| 8,334,675 | B2 * | 12/2012 | Wang | H02J 7/007192 320/129 |
| 8,493,024 | B2 * | 7/2013 | Kissel, Jr. | B60M 1/10 320/109 |
| 8,698,458 | B2 * | 4/2014 | Kim | H02J 7/00711 320/164 |
| 8,751,079 | B2 * | 6/2014 | Lederer | H01M 10/637 219/205 |
| 9,231,425 | B2 * | 1/2016 | Lee | B60L 58/18 |
| 9,331,364 | B2 * | 5/2016 | Ramaswamy | H01M 10/052 |
| 9,354,278 | B2 * | 5/2016 | Koba | G01R 31/367 |
| 9,469,202 | B2 * | 10/2016 | Miglioranza | B60L 50/64 |
| 9,673,657 | B2 * | 6/2017 | van Lammeren | H02J 7/00712 |
| 9,859,736 | B2 * | 1/2018 | Ling | H01M 10/44 |
| 9,866,056 | B2 * | 1/2018 | Ramaswamy | H01M 10/425 |
| 9,969,288 | B2 * | 5/2018 | Ikeda | B60L 53/14 |
| 9,991,726 | B2 * | 6/2018 | Small, Jr. | H02J 7/0071 |
| 10,023,067 | B2 * | 7/2018 | Delobel | B60L 58/15 |
| 10,067,198 | B2 * | 9/2018 | Maluf | H02J 7/0048 |
| 10,166,882 | B2 * | 1/2019 | Yang | B60L 53/00 |
| 10,186,887 | B2 * | 1/2019 | Wang | B60L 58/12 |
| 10,193,366 | B2 * | 1/2019 | Josephs | H02J 7/0013 |
| 10,256,512 | B2 * | 4/2019 | Sun | H02J 7/007194 |
| 10,821,843 | B2 * | 11/2020 | Slepchenkov | B60L 58/21 |
| 10,886,757 | B2 * | 1/2021 | Zuo | H01M 10/425 |
| 10,933,767 | B2 * | 3/2021 | Javaid | G06Q 20/322 |
| 11,075,524 | B2 * | 7/2021 | Small, Jr. | H02J 7/00 |
| 11,137,451 | B2 * | 10/2021 | Takahashi | G01R 31/389 |
| 11,355,793 | B2 * | 6/2022 | Yamamoto | B60L 50/64 |
| 11,397,215 | B2 * | 7/2022 | Ghantous | H02J 7/0047 |
| 11,440,429 | B2 * | 9/2022 | Lim | B60L 50/61 |
| 11,460,510 | B1 * | 10/2022 | Aoki | G01R 31/389 |
| 11,515,588 | B2 * | 11/2022 | Du | H01M 10/633 |
| 11,575,273 | B2 * | 2/2023 | Rauner | B60L 58/24 |
| 11,728,525 | B2 * | 8/2023 | Ghantous | H01M 10/44 702/63 |
| 11,840,149 | B2 * | 12/2023 | Slepchenkov | B60L 50/40 |
| 11,840,150 | B2 * | 12/2023 | Slepchenkov | B60L 15/007 |
| 11,846,675 | B2 * | 12/2023 | Li | G01K 7/42 |
| 2002/0070710 | A1 * | 6/2002 | Yagi | B60L 58/27 320/150 |
| 2008/0042621 | A1 * | 2/2008 | Miglioranza | H02J 7/1407 320/150 |
| 2009/0235095 | A1 * | 9/2009 | Okita | G06F 1/3268 713/300 |
| 2010/0320965 | A1 * | 12/2010 | Kissel, Jr. | B60L 53/32 320/109 |
| 2011/0282531 | A1 * | 11/2011 | Lederer | H01M 10/486 903/903 |
| 2012/0007547 | A1 * | 1/2012 | Kim | H02J 7/0069 320/150 |
| 2012/0025773 | A1 * | 2/2012 | Wang | H02J 7/00714 320/129 |
| 2012/0112696 | A1 * | 5/2012 | Ikeda | H01M 10/48 320/109 |
| 2012/0176082 | A1 * | 7/2012 | Lee | H01M 10/4264 903/907 |
| 2014/0218042 | A1 * | 8/2014 | Koba | G01R 31/367 324/430 |
| 2014/0266068 | A1 * | 9/2014 | O'Brien | B60L 3/003 320/139 |
| 2015/0221990 | A1 * | 8/2015 | Ramaswamy | H01M 10/052 204/229.4 |
| 2015/0288213 | A1 | 10/2015 | Van Lammeren et al. | |
| 2015/0377976 | A1 * | 12/2015 | Maluf | G01R 31/392 702/63 |
| 2016/0023563 | A1 * | 1/2016 | Wang | B60L 58/24 320/152 |
| 2016/0107534 | A1 * | 4/2016 | Ikeda | H01M 10/44 307/9.1 |
| 2016/0107535 | A1 * | 4/2016 | Delobel | H01M 10/44 320/162 |
| 2016/0134146 | A1 * | 5/2016 | Ling | H01M 10/48 320/136 |
| 2016/0152151 | A1 * | 6/2016 | Yang | B60L 58/27 320/109 |
| 2016/0185234 | A1 * | 6/2016 | Miglioranza | B60L 50/64 320/150 |
| 2016/0204624 | A1 * | 7/2016 | Small, Jr. | H02J 7/0047 320/139 |
| 2016/0204625 | A1 * | 7/2016 | Josephs | H02J 7/0048 320/139 |
| 2016/0218522 | A1 * | 7/2016 | Ramaswamy | H01M 10/4242 |
| 2018/0126863 | A1 * | 5/2018 | Delobel | B60L 58/15 |
| 2018/0287404 | A1 * | 10/2018 | Small, Jr. | H02J 7/0047 |
| 2018/0339597 | A1 * | 11/2018 | Kruszelnicki | B60L 53/305 |
| 2018/0339601 | A1 * | 11/2018 | Kruszelnicki | B60L 53/16 |
| 2019/0027792 | A1 * | 1/2019 | Sun | H01M 10/633 |
| 2019/0120910 | A1 | 4/2019 | Ghantous et al. | |
| 2019/0363550 | A1 * | 11/2019 | Zuo | H01M 10/425 |
| 2020/0215929 | A1 * | 7/2020 | Javaid | B60L 53/38 |
| 2020/0341068 | A1 * | 10/2020 | Takahashi | G01R 31/389 |
| 2020/0381784 | A1 * | 12/2020 | Yamamoto | H02J 7/007194 |
| 2020/0381788 | A1 * | 12/2020 | Du | H01M 10/633 |
| 2021/0001743 | A1 * | 1/2021 | Rauner | B60L 53/305 |
| 2021/0075069 | A1 * | 3/2021 | Zuo | H01M 10/63 |
| 2021/0148987 | A1 | 5/2021 | Ghantous et al. | |
| 2021/0170885 | A1 * | 6/2021 | Slepchenkov | B60L 50/40 |
| 2022/0001764 | A1 * | 1/2022 | Lim | H01M 10/48 |
| 2022/0173606 | A1 * | 6/2022 | Mihara | H01M 10/44 |
| 2022/0221516 | A1 * | 7/2022 | Lee | H01M 10/48 |
| 2022/0239120 | A1 * | 7/2022 | Sun | H02J 7/00032 |
| 2022/0239121 | A1 * | 7/2022 | Li | H02J 7/00036 |
| 2022/0239135 | A1 * | 7/2022 | Li | H02J 7/06 |
| 2022/0239140 | A1 * | 7/2022 | Li | B60L 53/11 |
| 2022/0263144 | A1 * | 8/2022 | Xie | H01M 10/425 |
| 2022/0271358 | A1 * | 8/2022 | Qin | H01M 10/637 |
| 2022/0299572 | A1 * | 9/2022 | Aoki | H02J 7/005 |
| 2022/0317198 | A1 | 10/2022 | Ghantous et al. | |
| 2022/0357399 | A1 * | 11/2022 | Li | G01R 31/374 |
| 2022/0390522 | A1 * | 12/2022 | Sherstyuk | G01R 31/385 |
| 2023/0006271 | A1 * | 1/2023 | Ghantous | H02J 7/0047 |
| 2023/0046587 | A1 * | 2/2023 | Zou | H02J 7/0048 |
| 2023/0064624 | A1 * | 3/2023 | Huang | H02J 7/00712 |
| 2023/0070522 | A1 * | 3/2023 | Xiong | H01M 10/44 |
| 2023/0076134 | A1 * | 3/2023 | Xiong | H01M 10/44 |

(56) References Cited

U.S. PATENT DOCUMENTS

| | | | |
|---|---|---|---|
| 2023/0105731 A1* | 4/2023 | Hallberg | B60L 58/21 307/10.1 |
| 2023/0120625 A1* | 4/2023 | Lou | H01M 10/44 320/137 |
| 2023/0202312 A1* | 6/2023 | Slepchenkov | B60L 58/12 320/104 |
| 2023/0231401 A1* | 7/2023 | Zhou | H02J 7/007188 307/10.1 |
| 2023/0268756 A1* | 8/2023 | Ma | H01M 10/44 |
| 2023/0335810 A1* | 10/2023 | Ghantous | H02J 7/0047 |
| 2023/0378799 A1* | 11/2023 | Fu | H02J 7/0048 |
| 2023/0387492 A1* | 11/2023 | Chen | H01M 10/633 |
| 2023/0396089 A1* | 12/2023 | Xie | H02J 7/007188 |
| 2023/0402672 A1* | 12/2023 | Chen | H01M 10/44 |
| 2024/0010103 A1* | 1/2024 | Li | B60L 58/27 |
| 2024/0030803 A1* | 1/2024 | Kazaoka | H02M 1/14 |
| 2024/0092211 A1* | 3/2024 | Zou | B60L 53/11 |
| 2024/0178473 A1* | 5/2024 | Li | H01M 10/63 |
| 2024/0178695 A1* | 5/2024 | Sun | H02J 7/005 |
| 2024/0186928 A1* | 6/2024 | Huang | H01M 10/615 |

FOREIGN PATENT DOCUMENTS

| | | |
|---|---|---|
| CN | 106253405 A | 12/2016 |
| CN | 109755682 A | 5/2019 |
| CN | 111162332 A | 5/2020 |
| CN | 112820963 A | 5/2021 |
| JP | 2002125326 A | 4/2002 |
| JP | 2019117685 A | 7/2019 |
| JP | 2021048016 A | 3/2021 |
| KR | 20190010400 A | 1/2019 |
| WO | 2021077213 A1 | 4/2021 |

OTHER PUBLICATIONS

Notice of Reasons for Refusal dated Oct. 23, 2023 received in Japanese Patent Application No. JP 2021-573559.

Notice of Allowance dated May 31, 2024 received in Korean Patent Application No. 10-2021-7040141.

\* cited by examiner

CHARGING CONTROL METHOD AND APPARATUS, BATTERY MANAGEMENT SYSTEM AND READABLE STORAGE MEDIUM

CROSS-REFERENCE TO RELATED APPLICATIONS

This application is a continuation of International Application No. PCT/CN2021/100724, filed on Jun. 17, 2021, the disclosure of which is hereby incorporated by reference in its entirety.

TECHNICAL FIELD

The present application relates to the technical field of batteries, and in particular, relates to a charging control method and apparatus, a battery management system and a readable storage medium.

BACKGROUND

Pulse charging is a battery charging technique for charging a battery with a pulse current. In the prior art, when performing the pulse charging, a bidirectional pulse current is generally employed to charge the battery and a pulse charging frequency will be set as a battery characteristic frequency. During a charging process, the battery characteristic frequency changes with a change in a battery temperature and the pulse charging frequency is adjusted according to the battery characteristic frequency until the end of the charging.

Employing the solution of the prior art cannot effectively determine the pulse charging frequency, and there are potential safety hazards. Therefore, the stability and safety of battery charging are poor.

SUMMARY

The objective of the present application is to provide a charging control method and apparatus, a battery management system and a readable storage medium for improving the stability and safety of the battery charging.

According to a first aspect, the present application provides a charging control method, including: obtaining a battery temperature and a battery state of charge; determining a pulse charging frequency according to the battery temperature, the battery state of charge and a pre-calibrated corresponding relationship, where the pre-calibrated corresponding relationship is a corresponding relationship between a battery temperature, a battery state of charge, and a pulse charging frequency; obtaining a preset waveform characteristic of a pulse charging waveform, where the waveform characteristic includes a ratio range of an area of a positive pulse waveform to an area of a negative pulse waveform in each pulse cycle of the pulse charging waveform; generating a charging request according to the pulse charging frequency and the waveform characteristic; and transmitting the charging request to a charging device.

In the present application, compared with the prior art, on one hand, the corresponding relationship between the pre-calibrated battery temperature, the state of charge and the pulse charging frequency is pre-calibrated, when a battery management system performs charging control, a real time battery temperature and state of charge are firstly obtained, and then based on the obtained battery temperature, the state of charge and the corresponding relationship, the pulse charging frequency is determined, thereby realizing effective determination of the pulse charging frequency. On the other hand, a waveform characteristic of a pulse charging waveform is preset, the waveform characteristic including a ratio range of an area of a positive pulse waveform to an area of a negative pulse waveform in each pulse cycle of the pulse charging waveform. Normal performing of the pulse charging can be ensured by setting the lower limit of the ratio range. By setting the upper limit of the ratio range, potential safety hazards caused by lithium plating of the battery due to excessively large positive pulse can be avoided. Furthermore, the safety and stability of the pulse charging of the battery by the charging device are improved, and the impact of battery charging on battery performance is avoided.

As a possible implementation, the waveform characteristic further includes a preset current peak of the positive pulse waveform corresponding to the battery temperature and the state of charge, and a preset current peak of the negative pulse waveform corresponding to the battery temperature and the state of charge, and a current peak of the negative pulse waveform is greater than a current peak of the positive pulse waveform.

In the present application, it is found through study on the charging pulse waveform that in a pulse cycle, if the current peak of the negative pulse waveform is greater than the current peak of the positive pulse waveform, the current peak increases after switching from positive pulse charging to negative pulse charging, in which case it is not easy to cause lithium plating and cell polarization for the battery. Therefore, by defining the current peak of the negative pulse waveform to be greater than the current peak of the positive pulse waveform in the waveform characteristic, safety of the pulse charging can be improved, and the impact on battery performance can be avoided.

As a possible implementation, the waveform characteristic further includes a positive pulse waveform characteristic; and the positive pulse waveform characteristic is represented as $$\int_{t1}^{t2} F(t) \geq \frac{I_{max+} * (t2 - t1)}{2};$$

where F(t) represents the positive pulse waveform, $\int_{t1}^{t2} F(t)$ is the area of the positive pulse waveform, t1 is a starting time of the positive pulse waveform, t2 is an ending time of the positive pulse waveform and $I_{max+}$ is a current peak of the positive pulse waveform.

In the present application, the positive pulse waveform characteristic can be understood as that the area of the positive pulse waveform is greater than half of the area of a rectangular region corresponding to the positive pulse waveform. Through the positive pulse waveform characteristic, the pulse charging can be ensured to realize a maximum discharging current.

As a possible implementation, a battery voltage corresponding to the current peak of the positive pulse waveform is smaller than a pre-calibrated charging cutoff voltage, and the charging cutoff voltage is a decomposition voltage of a battery electrolyte or a breakdown voltage value of a battery separator.

In the present application, with an increase of the current, a voltage increases correspondingly. The battery voltage corresponding to the current peak of the positive pulse waveform is an upper limit of the voltage, and the upper limit of the voltage can be limited through a charging cutoff voltage. The charging cutoff voltage is a decomposition voltage of a battery electrolyte or a breakdown voltage value of a battery separator. The two voltages are greater than a conventional charging cutoff voltage and the corresponding peak charging current is also larger. Therefore, by determining the two voltages as the voltage upper limit, the peak value of charging current can be increased to enable completion of charging for the battery as soon as possible, thus improving the charging efficiency of the battery.

As a possible implementation, a frequency range of the pulse charging frequency in the pre-calibrated corresponding relationship is: 200 Hz-1500 Hz.

In the present application, if the frequency is smaller than 200 Hz, it will be easy to cause lithium plating for the battery, thus causing attenuation of a capacity thereof. 1500 Hz can be understood as the maximum frequency that the charging device can reach. Therefore, by defining the frequency range, smooth completion of charging can be ensured for the charging device while ensuring security of battery charging and preventing effects on battery performance.

As a possible implementation, before the determining a pulse charging frequency according to the battery temperature, the battery state of charge and a pre-calibrated corresponding relationship, the charging control method further includes: determining whether the battery temperature is in a preset temperature range; and the determining a pulse charging frequency according to the battery temperature, the battery state of charge and a pre-calibrated corresponding relationship includes: when determining that the battery temperature is in the preset temperature range, determining the pulse charging frequency according to the battery temperature, the battery state of charge and the pre-calibrated corresponding relationship.

In the present application, when determining that the battery temperature is in the preset temperature range, the battery management system controls the battery to perform pulse charging, equivalent to that the charging control policy of the battery can be flexibly adjusted according to a temperature situation to improve charging flexibility of the battery.

As a possible implementation, an upper limit of the ratio range is 10 and a lower limit of the ratio range is 1.

In the present application, the lower limit of the ratio range is 1, in which case normal performing of the pulse charging can be ensured; and the upper limit of the ratio range is 10, in which case potential safety hazards caused by lithium plating of the battery due to excessively large positive pulse can be avoided.

According to a second aspect, the present application provides a charging control apparatus, including each functional module for realizing the charging control method in the first aspect and any possible implementation of the first aspect.

According to a third aspect, the present application provides a battery management system, including a processor and a memory communicatively connected with the processor, where the memory stores an instruction executable by the processor, and the instruction is executed by the processor to cause the processor to perform the charging control method in the first aspect and any possible implementation of the first aspect.

According to a fourth aspect, the present application provides a readable storage medium, where a computer program is stored on the readable storage medium, and when the computer program is operated by a computer, the charging control method in the first aspect and any possible implementation of the first aspect is performed.

BRIEF DESCRIPTION OF DRAWINGS

To describe the technical solutions in the embodiments of the present application more clearly, the following briefly describes the accompanying drawings required for describing the embodiments of the present application. Apparently, the accompanying drawings in the following description show merely some embodiments of the present application, and a person of ordinary skill in the art may still derive other drawings from these accompanying drawings without creative efforts.

Of the accompanying drawings, the accompanying drawings are not drawn according to actual proportions.

REFERENCE SIGNS: 10—charging system; 11—charging device; 12—battery management system; 120—processor; 121—memory; 122—communication module; 500—charging control apparatus; 510—obtaining module; and 520—processing module.

DESCRIPTION OF EMBODIMENTS

The following further describes the implementations of the present application in detail with reference to the accompanying drawings and embodiments. Detailed description of the following embodiments and accompanying drawings are used to illustratively state the principles of the present application, but not to limit the scope of the present application, that is, the present application is not limited to the embodiments described.

In the descriptions of the present application, it should be noted that unless otherwise described additionally, "plural" means more than two; and the orientations or positional relationships indicated by the terms "up", "down", "left", "right", "inside", "outside", and the like are merely intended to facilitate the descriptions of the present application and simplify the descriptions, but not intended to indicate or imply that the apparatuses or components mentioned must have specific orientations, or be constructed and operated for a specific orientation, and therefore shall not be understood as a limitation to the present application. In addition, the terms "first", "second" and "third" etc. are merely intended for a purpose of description, and shall not be understood as an indication or implication of relative importance. "Vertical" does not mean vertical in the strict sense, but to be vertical within a permitted range of an error. "Parallel" does not mean parallel in the strict sense, but to be parallel within a permitted range of an error.

The location words appearing in the following descriptions are all directions indicated in the drawings, but not to constitute any limitation to the specific structure of the present application. In the description of the present application, it should be further noted that unless otherwise prescribed and defined clearly, terms "mounting", "communicating" and "connection" should be understood in a broad sense, which for example can be a fixed connection and can also be a detachable connection or an integral connection; or can be a direct connection and can also be a connection through an intermediary. A person of ordinary skill in the art can understand specific meanings of these terms in the present application based on specific situations.

Figure 1:
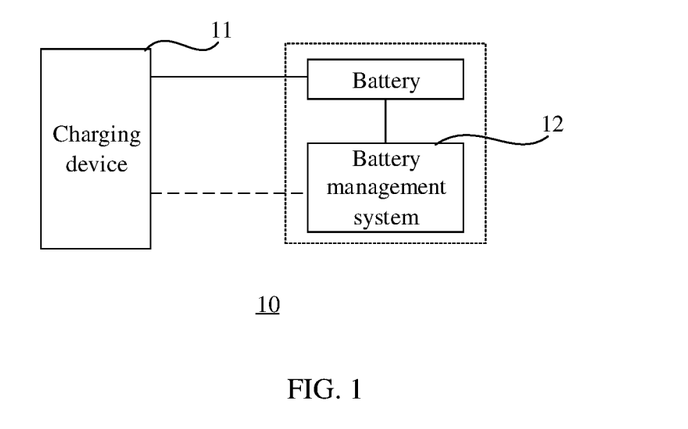
FIG. 1 is a schematic diagram of a charging system disclosed in one embodiment of the present application.

Please referring to FIG. 1, FIG. 1 shows a schematic diagram of a charging system 10 provided by embodiment of the present application. The charging system 10 includes a charging device 11, a battery management system 12 and a battery. When charging the battery through the charging device 11, the charging device 11 and the battery management system 12 are in a communication connection, the charging device 11 and the battery are in an electrical connection, and the battery management system 12 and the battery are in an electrical connection.

The charging device 11 can be a charging pile, a charging box, a charging cabinet or the like. Within the charging device 11, a DC charging module and a pulse charging module can be included, i.e. the charging device 11 can realize DC charging and can also realize pulse charging.

The battery management system 12 is used for managing the battery, such as management for various parameters like a SOC (state of charge) of the battery, a capacity of the battery and a temperature of the battery; and for performing charging control on the battery for example again. Therefore, a hardware environment to which the charging control method provided by embodiment of the present application is applied can be the battery management system 12 corresponding to the battery.

The hardware environment in which a battery system formed by the battery management system 12 and the battery is located can be an electric device such as an electric that uses a power battery as a power source. The electric vehicle can be for example an electric automobile, an electric motor and the like. Therefore, the charging control method provided by embodiment of the present application can be applied to various electric devices.

The battery can be various types of lithium batteries, for example, a lithium iron phosphate battery and a lithium iron sulfide battery etc.

When the charging device 11 and the battery management system 12 are in a communication connection, a charging message can interact between the charging device 11 and the battery management system 12. For example, the battery management system 12 transmits corresponding charging information to the charging device 11 in a form of the charging message, and the charging device 11 charges the battery based on the obtained charging information in the charging message.

Before the charging is started, a charging message can interact between the battery management system 12 and the charging device 11. During a charging process, the interaction of the charging message can be performed continuously between the battery management system 12 and the charging device 11. Further, the charging information can be adjusted and the charging policy of the battery can also be adjusted. For example, the frequency of the pulse charging can be adjusted and the waveform of the pulse charging can be adjusted etc.

Figure 2:
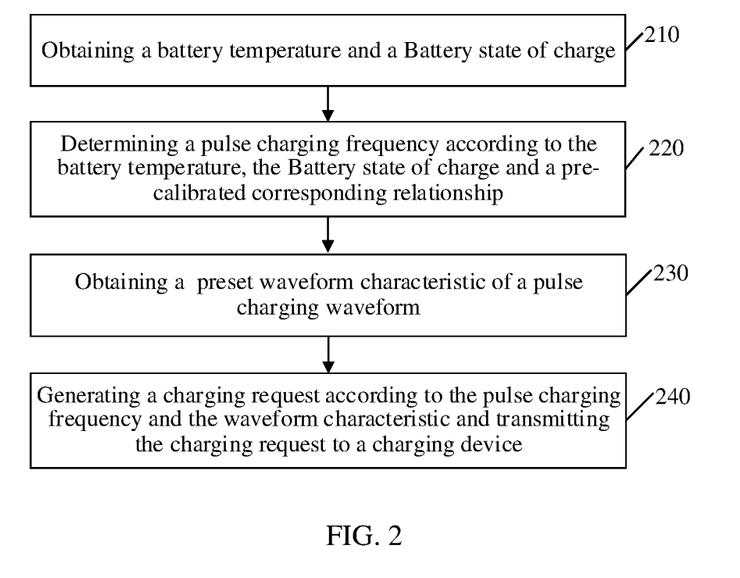
FIG. 2 is a flowchart of a charging control method disclosed in one embodiment of the present application.

Based on introduction to above application scenes, please referring to FIG. 2, FIG. 2 shows a flowchart of a charging control method provided by embodiment of the present application. The method can be applied to the battery management system 12, including:

step 210: obtaining a battery temperature and a battery SOC;

step 220: determining a pulse charging frequency according to the battery temperature, the battery SOC and a pre-calibrated corresponding relationship; where the pre-calibrated corresponding relationship is a corresponding relationship between a battery temperature, a battery SOC, and a pulse charging frequency;

step 230: obtaining a preset waveform characteristic of a pulse charging waveform; where the waveform characteristic includes a ratio range of an area of a positive pulse waveform to an area of a negative pulse waveform in each pulse cycle of the pulse charging waveform; and step 240: generating a charging request according to the pulse charging frequency and the waveform characteristic and transmitting the charging request to a charging device 11.

Employing the charging control method provided by embodiment of the present application, on one hand, the corresponding relationship between the pre-calibrated battery temperature, the battery SOC and the pulse charging frequency is pre-calibrated, when a battery management system 12 performs charging control, a real time battery temperature and battery SOC are firstly obtained, and then based on the obtained battery temperature, battery SOC and the corresponding relationship, the pulse charging frequency is determined, thereby realizing effective determination of the pulse charging frequency. On the other hand, a waveform characteristic of a pulse charging waveform is preset, the waveform characteristic including a ratio range of an area of a positive pulse waveform to an area of a negative pulse waveform in each pulse cycle of the pulse charging waveform. Normal performing of the pulse charging can be ensured by setting the lower limit of the ratio range. By setting the upper limit of the ratio range, potential safety hazards caused by lithium plating of the battery due to excessively large positive pulse can be avoided. Furthermore, the safety and stability of the pulse charging of the battery by the charging device 11 are improved, and the impact of battery charging on battery performance is avoided.

Detailed implementations of the charging control method are introduced below.

In step 210, the battery management system 12 can collect the battery temperature through a temperature collection module in a collection module of the charging information, realizing obtaining of the battery temperature. The temperature collection module can be a thermistor, a temperature sensor or the like. The battery management system 12 can also collect a voltage, a current, a power and other information of the battery through a voltage collection module, a current collection module, a power collection module and other collection modules of the collection module. Based on related information collected, the SOC of the battery is estimated, realizing obtaining of the SOC of the battery.

It can be understood that for the battery, the battery state information includes a battery temperature, a battery SOC, a voltage and a current etc. Accordingly, for the battery management system 12, in addition to obtaining the battery temperature and the battery SOC, can also obtain other battery state information when needed, such as a voltage, a current and the like of the battery.

In step 220, the corresponding relationship between the battery temperature, the battery SOC and the pulse charging frequency can be calibrated offline. Next, the implementation of the offline calibration is introduced.

In a process of the offline calibration, it is necessary to use a corresponding relationship between a cell impedance and a frequency. The relationship between the cell impedance and the frequency can be represented through a cell impedance-frequency curve (profile). The abscissa of the curve is the frequency of an AC signal and the ordinate of the curve is an AC impedance of a cell anode, which is divided into an impedance real part and an impedance imaginary part. With the increasing frequency of the AC signal, the AC impedance of the cell anode gradually decreases.

Based on the cell impedance-frequency curve, the process for determining a corresponding relationship between the frequency and the temperature includes: drawing a plurality of curves of the real part and the imaginary part for one same cell under different temperature conditions and different cell capacities, to obtain the curve functions of the real part and the imaginary part respectively. Then, one derivative is performed on the curve functions. When the derivative is negative and the derivative is smaller than a preset threshold for the first time, the frequency (abscissa value) corresponding to the derivative is a minimum value of the pulse charging frequency.

In the above process, under the same temperature condition, the corresponding pulse current frequencies can also be obtained respectively for different SOC ranges, thus obtaining the pulse charging frequencies of different SOC ranges under the same temperature condition.

For example, it is assumed that there are four curves for the imaginary part, four corresponding frequency values can be obtained under different SOC ranges at the same temperature.

In embodiment of the present application, when calibrating the corresponding relationship, the pulse charging frequency can also be limited in a fixed frequency range.

It is found from the cell impedance-frequency curve that when the pulse charging frequency is greater than a particular value, the effective values for the impedance real part and the impedance imaginary part decrease greatly. Therefore, within a certain range, if the frequency of the pulse charging current is larger, it will be uneasier to cause lithium plating for the cell.

Therefore, the lower limit of the frequency in the fixed frequency range can be set according to the frequency value at which the effective values of the impedance real part and the impedance imaginary part start to decrease greatly. With the 173 Ah lithium iron phosphate cell as an example, after the pulse charging frequency becomes greater than 195 Hz, the effective values of the impedance real part and the impedance imaginary part decrease greatly. Further, the lower limit for the frequency of the frequency range corresponding to the cell can be a frequency value which is slightly greater than 195 Hz, such as 200 Hz.

The battery capacity will correspondingly decrease in case of lithium plating occurring to the battery. Therefore, in addition to the above implementation, a conventional battery charging and discharging capacity test can also be performed at a normal temperature. When the battery capacity decreases compared with the normal battery capacity, the corresponding frequency value can be determined as the frequency lower limit of the frequency range.

For the charging device 11, as the generator of the pulse current, there is a limit to the pulse charging frequency it can provide. If the pulse charging frequency is excessively large, the charging device 11 cannot provide the corresponding pulse charging current possibly. Therefore, the frequency upper limit of the fixed frequency range can be set according to the charging device 11.

As an alternative implementation, in the battery management system 12, the frequency upper limit value suitable to the most charging device 11 can be directly preset.

As another alternative implementation, the battery management system 12 can interact a message with the charging device 11, such that the battery management system 12 determines the maximum pulse charging frequency acceptable by the charging device 11.

For example, the battery management system 12 provides several optional maximum pulse charging frequencies to the charging device 11. The charging device 11 determines a maximum pulse charging frequency adaptive to itself therefrom and then transmits the maximum pulse charging frequency to the battery management system 12. For example again, the charging device 11 voluntarily transmits its acceptable maximum pulse charging frequency to the battery management system 12.

In embodiment of the present application, an optional pulse charging frequency ranging between 200 Hz and 1500 Hz is provided. The pulse charging frequency range can be applied to the lithium iron phosphate battery and most of the charging device 11.

By defining the frequency range, smooth completion of charging can be ensured for the charging device 11 while ensuring security of battery charging and preventing effects on battery performance.

Please referring to Table 1, Table 1 shows an example of a corresponding relationship of a battery temperature, a battery SOC and a pulse charging frequency provided by embodiment of the present application. It can be understood that the corresponding relationship shown in Table 1 is only an example, which does not constitute any limitation to embodiment of the present application.

In Table 1, four SOC ranges are included under each temperature condition, and each SOC range corresponds to one pulse charging frequency. Based on the corresponding relationship, and the battery temperature and the battery SOC which are obtained in real time basis, the pulse charging frequency can be determined. For example, it is assumed that the battery temperature is $-16°$ C. and the battery SOC is 40%, the pulse charging frequency will be 1400 Hz. It is assumed that the battery temperature is $2°$ C., the pulse charging frequency will be 300 Hz regardless of how much the battery SOC is.

TABLE 1

| Temperature (° C.) | Frequency (Hz) | SOC range |
|---|---|---|
| −20~−15 | 1350 | 0-10% |
|  | 1400 | 10-50% |
|  | 1450 | 60-80% |
|  | 1500 | 80-95% |
| −15~−10 | 1050 | 0-10% |
|  | 1100 | 10-50% |
|  | 1150 | 60-80% |
|  | 1200 | 80-95% |
| −10~−5 | 850 | 0-10% |
|  | 900 | 10-50% |
|  | 950 | 60-80% |
|  | 1000 | 80-95% |
| −5~0 | Same as above | 0-10% |
|  |  | 10-50% |
|  |  | 60-80% |
|  |  | 80-95% |

TABLE 1-continued

| Temperature (° C.) | Frequency (Hz) | SOC range |
|---|---|---|
| 0~5 | 300 | 0-10% |
|  |  | 10-50% |
|  |  | 60-80% |
|  |  | 80-95% |

In step 230, the battery management system 12 obtains a preset waveform characteristic of a pulse charging waveform. The waveform characteristic includes a ratio range of an area of a positive pulse waveform to an area of a negative pulse waveform in each pulse cycle of the pulse charging waveform.

Figure 3:
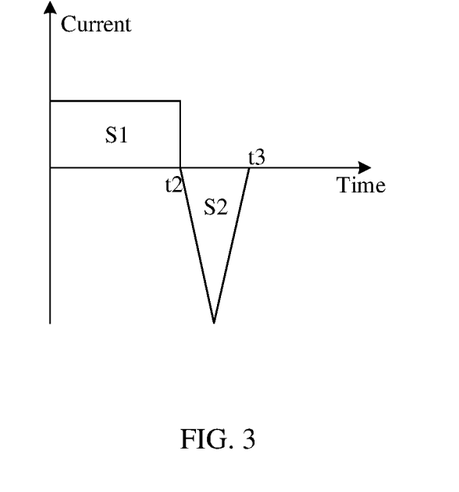
FIG. 3 is an illustrative diagram of a pulse charging waveform disclosed in one embodiment of the present application.
Figure 4:
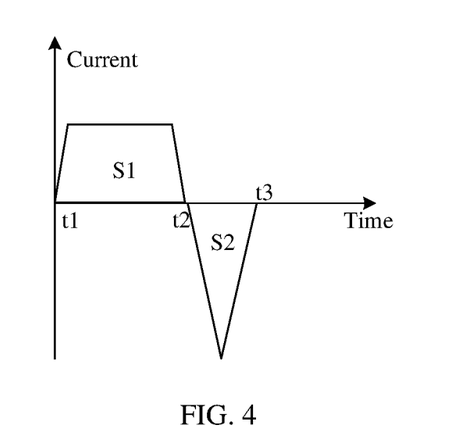
FIG. 4 is an illustrative diagram of a pulse charging waveform disclosed in one another embodiment of the present application.

To facilitate understanding, please referring to FIG. 3 and FIG. 4, two examples of the pulse charging waveforms in one pulse cycle are provided for the present application. In FIG. 3 and FIG. 4, the waveform function is F(t), the pulse charging waveform in the period of t1-t2 is the positive pulse waveform, the pulse charging waveform in the period of t2-t3 is the negative pulse waveform, and t1-t3 is a pulse cycle. Correspondingly, the area of S1 region is the area of the positive pulse waveform and the area of S2 region is the area of the negative pulse waveform.

By combining examples of FIG. 3 and FIG. 4, the waveform characteristic can be represented as: A≤S1/S2≤B. By setting the upper limit (B) of the ratio range, the potential safety hazard of battery lithium plating can be avoided due to too large the positive pulse. By setting the lower limit (A) of the ratio range, normal performing of the pulse charging can be ensured.

By combining functions of the upper limit and the lower limit of the ratio range, upon presetting the ratio range, the lower limit of the ratio range can be determined according to a minimum area ratio that ensures the pulse charging. The upper limit of the ratio range at which battery lithium plating does not occur can be determined through the battery lithium plating situation according to different area ratios measured offline.

As an alternative implementation, the ratio range can be 1-10, then the above waveform characteristic can be represented as: 1≤S1/S2≤10.

In addition to possibly causing battery lithium plating by excessively large positive pulse, other reasons also can cause battery lithium plating. Therefore, the waveform characteristic can further include more limiting conditions.

It is found through study on the pulse charging waveform that: in a pulse cycle, if the current peak of the negative pulse waveform is greater than the current peak of the positive pulse waveform, the current peak increases after the positive pulse charging is converted into the negative pulse charging, in which case it is not easy to cause lithium plating and cell polarization for the battery. Therefore, as an optional implementation, the waveform characteristic further includes a preset current peak of the positive pulse waveform corresponding to the battery temperature and the battery state of charge, and a preset current peak of the negative pulse waveform corresponding to the battery temperature and the battery state of charge; and a current peak of the negative pulse waveform is greater than a current peak of the positive pulse waveform.

In such an implementation, it is assumed that the preset value of the current peak of the positive pulse waveform is M and the preset value of the current peak of the negative pulse waveform is N, M may be different and N may also be different at different temperatures. However, N is greater than M all the time. At the same temperature, the battery SOC may be different, M may be different and N may also be different. However, N is greater than M all the time.

As an optional implementation, the pre-calibrated corresponding relationship can also be a relationship between the battery temperature, the battery state of charge, the pulse charging frequency, the current peak of the positive pulse waveform and the current peak of the negative pulse waveform in addition to the relationship between the battery temperature, the battery state of charge and the pulse charging frequency.

If this kind of the implementation is employed, after determining the pulse charging frequency based on the corresponding relationship in step 220, the current peak of the corresponding positive pulse waveform and the current peak of the negative pulse waveform can be determined by combining the corresponding relationship.

As another optional implementation, it can also be pre-calibrated as a relationship between the battery temperature, the battery state of charge, and the current peak of the positive pulse waveform and the current peak of the negative pulse waveform. In step 230, the current peak of the positive pulse waveform and the current peak of the negative pulse waveform are determined by combining the corresponding relationship with the real time battery temperature and the real time state of charge.

It can be understood that in the process of the pulse charging, with an increase of the pulse current, a battery voltage increases correspondingly. The battery voltage corresponding to the current peak of the positive pulse waveform is a voltage upper limit, and the voltage upper limit of the battery can be calibrated through a charging cutoff voltage, that is, the battery voltage corresponding to the current peak of the positive pulse waveform is smaller than the pre-calibrated charging cutoff voltage.

The charging cutoff voltage is a decomposition voltage of a battery electrolyte or a breakdown voltage of a battery separator. No matter the decomposition voltage or the breakdown voltage, both can be determined through offline measurement.

Based on the pre-calibrated charging cutoff voltage, the voltage upper limit of can be determined. Then, the current peak of the positive pulse waveform can be determined based on a positive correlation between the voltage and the current.

In a conventional DC charging, if the current is excessively large, electronic ions can transfer quickly, causing a polarized voltage to reach a peak value rapidly, and the battery will quickly reach the fully charged state, and the battery can no longer be charged. What is employed in embodiment of the present application is the pulse charging. A pulse charging cycle is set for the pulse charging. In a pulse charging cycle, electric ions transfer back and forth based on the positive and negative pulses. If the current is excessively large, the polarized voltage will not reach the peak value. Therefore, the current peak can be large as far as possible during the pulse charging.

In embodiment of the present application, the decomposition voltage of a battery electrolyte or the breakdown voltage value of a battery separator is selected as the charging cutoff voltage. The two voltages are greater compared with a conventional charging cutoff voltage (for example a charging cutoff voltage of DC charging) and the corresponding charging current peak is also larger. Therefore, the peak charging current can be increased by determining the two voltages as the voltage upper limit to enable completion of charging for the battery as soon as possible, thus improving the charging efficiency of the battery.

For the current peak value of the negative pulse waveform, the corresponding battery voltage is greater than a pre-calibrated discharging cutoff voltage. The discharging cutoff voltage here is a conventional discharging cutoff voltage, without the need of combining particular battery characteristics for offline measurement. This is not introduced in details by embodiment of the present application.

Based on Table 1, please referring to Table 2, Table 2 shows an example of a corresponding relationship of a battery temperature, a battery SOC, a pulse charging frequency, a current peak of a positive pulse waveform and a current peak of the negative pulse waveform provided by embodiment of the present application. It can be understood that the corresponding relationship shown in Table 2 is only an example, which does not constitute any limitation to embodiment of the present application.

In Table 2, four SOC ranges are included under each temperature condition and each SOC range corresponds to one positive current peak (i.e. a current peak of a positive pulse waveform) and a negative current peak (i.e. a current peak of a negative pulse waveform). Based on the corresponding relationship, and the battery temperature and the battery state of charge which are obtained in real time, the positive current peak and the negative current peak can be determined. For example, it is assumed that the battery temperature is −16° C. and the battery SOC is 40%, the positive current peak will be 0.05 C (C represents Columb, in a unit) and the negative current peak will be 0.1 C. It is assumed that the battery temperature is 2° C. and the battery SOC is 80%, the positive current peak will be 0.3 C, and the negative current peak will be 1.2 C.

TABLE 2

| Temperature (° C.) | Frequency (Hz) | SOC range | Positive current peak | Negative current peak |
|---|---|---|---|---|
| −20~−15 | 1350 | 0-10% | 0.05 C | 0.1 C |
|  | 1400 | 10-50% | 1 C | 1.2 C |
|  | 1450 | 60-80% | 0.8 C | 1.2 C |
|  | 1500 | 80-95% | 0.3 C | 1.2 C |
| −15~−10 | 1050 | 0-10% | 0.1 C | 0.1 C |
|  | 1100 | 10-50% | 2 C | 1.2 C |
|  | 1150 | 60-80% | 1.6 C | 1.2 C |
|  | 1200 | 80-95% | 0.6 C | 1.2 C |
| −10~−5 | 850 | 0-10% | 0.05 C | 0.1 C |
|  | 900 | 10-50% | 1 C | 1.2 C |
|  | 950 | 60-80% | 0.8 C | 1.2 C |
|  | 1000 | 80-95% | 0.3 C | 1.2 C |
| −5~0 | Same as above | 0-10% | 0.05 C | 0.1 C |
|  |  | 10-50% | 1 C | 1.2 C |
|  |  | 60-80% | 0.8 C | 1.2 C |
|  |  | 80-95% | 0.3 C | 1.2 C |
| 0~5 | 300 | 0-10% | 0.05 C | 0.1 C |
|  |  | 10-50% | 1 C | 1.2 C |
|  |  | 60-80% | 0.8 C | 1.2 C |
|  |  | 80-95% | 0.3 C | 1.2 C |

In order to ensure that the pulse charging can realize the maximum discharging current, the area of the positive pulse waveform should be large as far as possible. Based on the characteristic, the waveform characteristic can further include a positive pulse waveform characteristic. By combining examples of FIG. 3 and FIG. 4, the positive pulse waveform characteristic is represented as $$\int_{t1}^{t2} F(t) \geq \frac{I_{max+} * (t2 - t1)}{2},$$

where F(t) represents the positive pulse waveform, F(t) is an area of the positive pulse waveform, t1 is a starting time of the positive pulse waveform, t2 is an ending time of the positive pulse waveform and $I_{max+}$ is a current peak of the positive pulse waveform.

The positive pulse waveform characteristic can be understood as that the area of the positive pulse waveform is greater than half of the area of a rectangular region corresponding to the positive pulse waveform. In FIG. 3, the area of the positive pulse waveform and the area of the rectangular region corresponding to the positive pulse waveform are equal, complying with the condition. In FIG. 4, the area of the positive pulse waveform is greater than half of the area of the rectangular region corresponding to the positive pulse waveform, complying with the condition as well.

After the above several types of the waveform characteristic and the pulse charging frequency are determined, the duty cycle of the pulse charging waveform (decided by the pulse charging frequency), a positive pulse current amplitude, a negative pulse current magnitude, a ratio of effective values of the positive and negative pulses (area), the cutoff voltage of the positive and negative pulses of the battery, and other information are also defined accordingly.

In an actual application, the waveform characteristic can include at least one waveform characteristic among the above several types of waveform characteristics, i.e. including at least one of a ratio of areas of positive and negative pulses, the positive pulse current amplitude, the negative pulse current amplitude, and the positive pulse waveform characteristic.

Although the waveform characteristic is limited, the waveform shape of the pulse charging waveform is not limited. No matter the positive pulse or the negative pulse, under the precondition of satisfying the waveform characteristic, both can be a square wave, a trapezoidal wave, a sinusoidal wave and the like, and can also be a distortion or a superposition of these waveforms, and it is not limited to a certain particular waveform.

Further, in step 240, upon generating a charging request according to the pulse charging frequency and the waveform characteristic, the charging request can include a pulse charging frequency and a waveform characteristic; and it can also include some optional waveform shapes, and it can also include a battery temperature.

Since each of the above waveform characteristics has a corresponding improvement effect on lithium plating of the battery, the waveform characteristic can be limited flexibly in combination with actual lithium plating risks of the battery. The lithium plating risks of the battery can be generally judged in combination with the battery temperature.

The waveform characteristic in the charging request can be a specified waveform characteristic determined by the battery management system 12 in combination with the current battery temperature. For example, when the current battery temperature is low, the waveform characteristic can include an area ratio of positive and negative pulses, the positive pulse current amplitude, the negative pulse current amplitude, and the positive pulse waveform characteristic. When the present battery temperature is a normal temperature, the waveform characteristic can include 1-3 waveform characteristics, such as including an area ratio of positive and negative pulses, the positive pulse current amplitude and the negative pulse current amplitude.

The charging request can also include each waveform characteristic above: an area ratio of positive and negative pulses, the positive pulse current amplitude, the negative pulse current amplitude and the positive pulse waveform characteristic; and the charging request further includes the battery temperature. In such an implementation, the battery management system 12 feeds each of the waveform characteristics determined back to the charging device 11, and the charging device 11 can determine the waveform characteristic matching the battery temperature therefrom by combining the battery temperature. Regarding the determining manner, reference can be made to the implementation of determining the designated waveform characteristic by the battery management system 12 in combination with the battery temperature.

Further, for the charging device 11, after receiving the charging request, a corresponding pulse charging current is generated according to each charging information in the charging request to perform pulse charging on the battery.

As an optional implementation, based on the pulse charging frequency in the charging request, the frequency of the pulse charging waveform finally output by the charging device 11 may be equal to the pulse charging frequency, or may be a certain frequency higher than the pulse charging frequency.

Better effects can be achieved when the pulse charging technique is applied to a situation in which the battery temperature is low. Therefore, in an actual application, if the charging device 11 is simultaneously equipped with a DC charging module and a pulse charging module, the pulse charging and the DC charging can be flexibly adjusted.

As an optional implementation, before step 240, the method further includes determining whether the battery temperature is in a preset temperature range; and when determining that the battery temperature is in the preset temperature range, performing step 240.

In such an implementation, the preset temperature range is equivalent to the condition of the pulse charging manner. Only when the temperature is in the preset temperature range, the pulse charging is employed. When the temperature is not in the preset temperature range, the conventional DC charging can be employed.

The preset temperature range for example can be (-∞, 5° C.], i.e. when the battery temperature is smaller than or equal to 5° C., the pulse charging is employed; and when the battery temperature is greater than 5° C., the DC charging is employed.

Through such an implementation, the charging control policy of the battery can be flexibly adjusted according to the temperature situation to improve flexibility of the battery charging.

It can be understood that the battery can also be charged in pulses throughout the entire process, until the battery is fully charged. However, the frequency of the pulse charging changes accordingly with a change in the battery temperature through charging control of the battery management system 12.

In embodiment of the present application, no matter the pre-calibrated corresponding relationship or the preset waveform characteristic of the pulse charging waveform, both are pre-calibrated. Through these calibration information, charging of the battery at the low temperature can be realized and effects of the pulse charging on the battery performance can also be prevented. However, due to the pre-calibrated information, it may be possible that the effects of other factors on the battery are not considered in the using process of the battery, for example inaccurate estimation of the battery SOC, using loss of the battery itself and the like. When the battery is used for a short time, the effect of the battery charging is better. If the battery is used for a long time, the effect of the battery charging may not be ideal.

Therefore, in considering effects of other factors caused on the battery in the using process of the battery, embodiment of the present application provide two updated implementations for the pre-calibrated corresponding relationship and the preset waveform characteristic.

The first optional implementation is updated through interaction with the charging device 11 for the pulse charging frequency in the corresponding relationship. Specifically, before each charging, the battery management system 12 requests the maximum pulse charging frequency (it can be understood as the actual maximum pulse charging frequency) that the charging device 11 can output, and compares the actual maximum pulse charging frequency with the maximum pulse charging frequency (it can be understood as the theoretical maximum pulse charging frequency) in the corresponding relationship. If the actual maximum pulse charging frequency is greater than or equal to the theoretical maximum pulse charging frequency, it is not necessary to update each pulse charging frequency in the corresponding relationship. If the actual maximum pulse charging frequency is smaller than the theoretical maximum pulse charging frequency, the preset amount decreases for each pulse charging frequency in the corresponding relationship. The preset amount can be a difference value between the actual maximum pulse charging frequency and the theoretical maximum pulse frequency.

Regarding the positive pulse amplitude and the negative pulse amplitude, the corresponding relationship between the number of battery charging times and an amplitude loss amount is preset. The battery management system 12 can record the charging times of the battery. For example, after each battery is fully charged, the number of battery charging times is +1, and the initial value of the battery charging times is 0. After the number of the battery charging times reaches the corresponding charging times in the corresponding relationship, the corresponding amplitude loss amount is subtracted on the basis of the original positive pulse amplitude and negative pulse amplitude.

The positive pulse waveform characteristic and the ratio range of areas of the positive and negative pulses of the waveform characteristic generally do not change with the change of the battery performance, so there is no need to update.

With the second optional implementation, after end of each full charging, the battery management system 12 records the maximum SOC that the battery can reach. When the maximum SOC that the battery can reach is smaller than the preset SOC, the corresponding reminding information is output and the reminding information is used to indicate update of the pre-calibrated corresponding relationship and the waveform characteristic.

In such an implementation, the battery management system 12 estimates loss of the battery through the change of the SOC, thus reminding update according to the loss of the battery. After a corresponding user receives the reminding information, offline calibration can be performed again on the battery to realize update of the pre-calibrated corresponding relationship and the waveform characteristic.

In an actual application, other feasible implementations can also be employed to update the pre-calibrated corresponding relationship and the waveform characteristic, which are not limited by embodiment of the present application.

Figure 5:
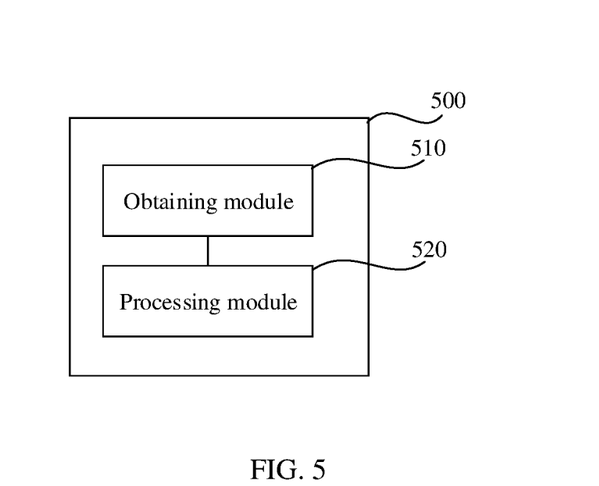
FIG. 5 is a structural diagram of a charging control apparatus disclosed in one embodiment of the present application.

Based on the same inventive concept, please referring to FIG. 5, embodiment of the present application further provides a charging control apparatus 500, including an obtaining module 510 and a processing module 520.

The obtaining module 510 is used for obtaining a battery temperature and a battery state of charge. The processing module 520 is configured to determine a pulse charging frequency according to the battery temperature, the battery state of charge and a pre-calibrated corresponding relationship, where the pre-calibrated corresponding relationship is a corresponding relationship between a battery temperature, a battery state of charge, and a pulse charging frequency. The obtaining module 510 is further configured to obtain a preset waveform characteristic of a pulse charging waveform; the waveform characteristic includes a ratio range of an area of a positive pulse waveform to an area of a negative pulse waveform in each pulse cycle of the pulse charging waveform; and the processing module 520 is further configured to generate a charging request according to the pulse charging frequency and the waveform characteristic and transmitting the charging request to a charging device 11.

In embodiment of the present application, the processing module 520 is further configured to determine whether the battery temperature is in a preset temperature range; and the processing module 520 is further configured to: when determining that the battery temperature is in the preset temperature range, determine the pulse charging frequency according to the battery temperature, the battery state of charge and the pre-calibrated corresponding relationship.

The charging control apparatus 500 corresponds to the charging control method introduced in the previous embodiments and each functional module is also in one-to-one correspondence to each step of the charging control method. Therefore, regarding the implementations of each functional module, reference can be made to the implementations of the charging control method, which is not introduced herein repeatedly.

Figure 6:
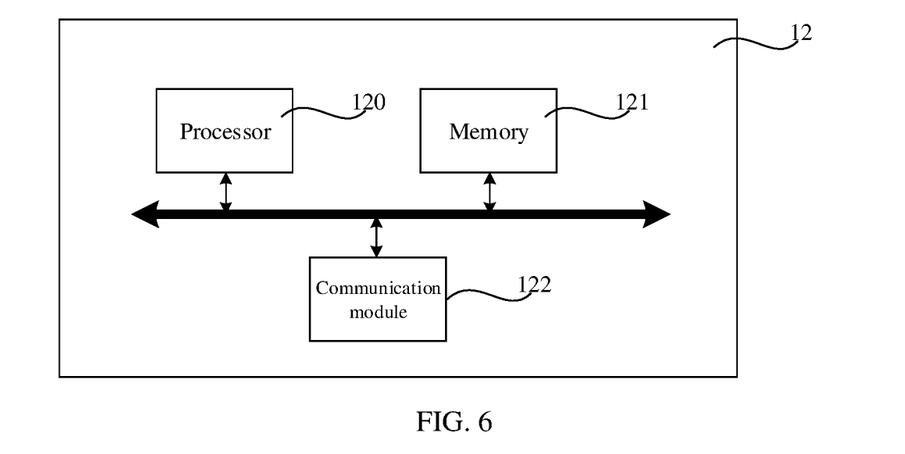
FIG. 6 is a structural diagram of a battery management system disclosed in one embodiment of the present application.

Based on the same inventive concept, please referring to FIG. 6, embodiment of the present application further provides a battery management system 12, including a processor 120, a memory 121 and a communication module 122.

The processor 120, the memory 121 and the communication module 122 are electrically connected to each other directly or indirectly to realize transmission or interaction of data. For example, these elements can be electrically connected through one or more communication buses or signal buses. The charging control method respectively includes at least one software function module stored in the memory 121 in the form of a software or a firmware.

The processor 120 may be an integrated circuit chip and has a signal processing capability. The processor 120 may be a general purpose processor, including a central processing unit (CPU), a network processor (NP) and the like; and can also be a digital signal processor, a specific integrated circuit, a field programmable gate array or other programmable logic devices, a discrete gate or a transistor logic device, or a discrete hardware component. The methods, steps, and logical block diagrams that are disclosed in embodiments of the present application may be implemented or performed. The general purpose processor may be a microprocessor, or the processor may also be any conventional processor or the like.

The memory 121 can store various software programs and modules, such as the charging control method provided by embodiment of the present application and the program instruction/module corresponding to the apparatus. The processor 120 thus performs various function applications and data processing by running the software programs and modules stored in the memory 121, i.e. implementing the technical solution in embodiments of the present application.

The memory 121 can include but not be limited to a random access memory (RAM), a read-only memory (ROM), a programmable read-only memory (PROM), an erasable programmable read-only memory (EPROM), and an electric erasable programmable read-only memory (EEPROM) etc.

The communication module 122 is configured to realize a communication connection between the battery management system 12 and the charging device 11, which can be a wireless communication module, a Bluetooth communication module and a 4G/5G communication module etc.

It can be understood that the component shown in FIG. 6 is only an example and the battery management system 12 can further include more components and for example can also include a temperature collection module etc.

Embodiment of the present application further provides an electric vehicle, including a power battery and the battery management system 12 shown in FIG. 6, and further includes a vehicle controller and basic structures or components equipped for other electric vehicles.

Embodiment of present application further provides a readable storage medium, where a computer program is stored on the readable storage medium and when the computer program is operated by a computer, the charging control method provided by embodiments of the present application is performed.

Although the present application has been described with reference to preferred embodiments, various improvements can be made thereto and equivalents can be used for replacement of members therein without departing from the scope of the present application. In particular, as long as a structural conflict does not exist, each technical characteristic mentioned in each embodiment can be combined in any manner. The present application is not restricted to particular embodiments disclosed herein, but to include all technical solutions falling in the scope of the claims.

What is claimed is:

1. A charging control method, comprising:
    obtaining a battery temperature and a battery state of charge;
    determining a pulse charging frequency according to the battery temperature, the battery state of charge and a pre-calibrated corresponding relationship, wherein the pre-calibrated corresponding relationship is a corresponding relationship between a battery temperature, a battery state of charge, and a pulse charging frequency;
    obtaining a preset waveform characteristic of a pulse charging waveform, wherein the waveform characteristic comprises a ratio range of an area of a positive pulse waveform to an area of a negative pulse waveform in each pulse cycle of the pulse charging waveform, an upper limit of the ratio range is 10 and a lower limit of the ratio range is 1;
    generating a charging request according to the pulse charging frequency and the waveform characteristic; and
    transmitting the charging request to a charging device.

2. The charging control method according to claim 1, wherein a frequency range of the pulse charging frequency in the pre-calibrated corresponding relationship is: 200 Hz-1500 Hz.

3. The charging control method according to claim 1, wherein before the determining a pulse charging frequency according to the battery temperature, the battery state of charge and a pre-calibrated corresponding relationship, the charging control method further comprises:
  determining whether the battery temperature is in a preset temperature range;
  the determining a pulse charging frequency according to the battery temperature, the battery state of charge and a pre-calibrated corresponding relationship comprises:
  when determining that the battery temperature is in the preset temperature range, determining the pulse charging frequency according to the battery temperature, the battery state of charge and the pre-calibrated corresponding relationship.

4. The charging control method according to claim 1, wherein the waveform characteristic further comprises a preset current peak of the positive pulse waveform corresponding to the battery temperature and the state of charge, and a preset current peak of the negative pulse waveform corresponding to the battery temperature and the state of charge, and the current peak of the negative pulse waveform is greater than the current peak of the positive pulse waveform.

5. The charging control method according to claim 4, wherein the waveform characteristic further comprises a positive pulse waveform characteristic, the positive pulse waveform characteristic is represented as $$\int_{t1}^{t2} F(t) \geq \frac{I_{max+} * (t2 - t1)}{2};$$

wherein F(t) represents the positive pulse waveform, $\int_{t1}^{t2} F(t)$ is the area of the positive pulse waveform, t1 is a starting time of the positive pulse waveform, t2 is an ending time of the positive pulse waveform and $I_{max+}$ is a current peak of the positive pulse waveform.

6. The charging control method according to claim 4, wherein a battery voltage corresponding to the current peak of the positive pulse waveform is smaller than a pre-calibrated charging cutoff voltage, and the charging cutoff voltage is a decomposition voltage of a battery electrolyte or a breakdown voltage value of a battery separator.

7. A battery management system, comprising a processor; and a memory communicatively connected with the processor;
  wherein the memory stores an instruction executable by the processor, and the instruction is executed by the processor to cause the processor to perform a charging control method, and the charging control method comprises:
  obtaining a battery temperature and a battery state of charge;
  determining a pulse charging frequency according to the battery temperature, the battery state of charge and a pre-calibrated corresponding relationship, wherein the pre-calibrated corresponding relationship is a corresponding relationship between a battery temperature, a battery state of charge, and a pulse charging frequency;
  obtaining a preset waveform characteristic of a pulse charging waveform, wherein the waveform characteristic comprises a ratio range of an area of a positive pulse waveform to an area of a negative pulse waveform in each pulse cycle of the pulse charging waveform, an upper limit of the ratio range is 10 and a lower limit of the ratio range is 1;
  generating a charging request according to the pulse charging frequency and the waveform characteristic; and
  transmitting the charging request to a charging device.

8. The battery management system according to claim 7, wherein a frequency range of the pulse charging frequency in the pre-calibrated corresponding relationship is: 200 Hz-1500 Hz.

9. The battery management system according to claim 7, before the determining a pulse charging frequency according to the battery temperature, the battery state of charge and a pre-calibrated corresponding relationship, the charging control method further comprises:
  determining whether the battery temperature is in a preset temperature range;
  the determining a pulse charging frequency according to the battery temperature, the battery state of charge and a pre-calibrated corresponding relationship comprises:
  when determining that the battery temperature is in the preset temperature range, determining the pulse charging frequency according to the battery temperature, the battery state of charge and the pre-calibrated corresponding relationship.

10. The battery management system according to claim 7, wherein the waveform characteristic further comprises a preset current peak of the positive pulse waveform corresponding to the battery temperature and the state of charge, and a preset current peak of the negative pulse waveform corresponding to the battery temperature and the state of charge, and the current peak of the negative pulse waveform is greater than the current peak of the positive pulse waveform.

11. The battery management system according to claim 10, wherein the waveform characteristic further comprises a positive pulse waveform characteristic, the positive pulse waveform characteristic is represented as $$\int_{t1}^{t2} F(t) \geq \frac{I_{max+} * (t2 - t1)}{2};$$

wherein F(t) represents the positive pulse waveform, $\int_{t1}^{t2} F(t)$ is the area of the positive pulse waveform, t1 is a starting time of the positive pulse waveform, t2 is an ending time of the positive pulse waveform and $I_{max+}$ is a current peak of the positive pulse waveform.

12. The battery management system according to claim 10, wherein a battery voltage corresponding to the current peak of the positive pulse waveform is smaller than a pre-calibrated charging cutoff voltage, and the charging cutoff voltage is a decomposition voltage of a battery electrolyte or a breakdown voltage value of a battery separator.

13. A readable storage medium, wherein a computer program is stored on the readable storage medium, and when the computer program is operated by a computer, a charging control method is performed, and the charging control method comprises:
  obtaining a battery temperature and a battery state of charge;
  determining a pulse charging frequency according to the battery temperature, the battery state of charge and a pre-calibrated corresponding relationship, wherein the pre-calibrated corresponding relationship is a corresponding relationship between a battery temperature, a battery state of charge, and a pulse charging frequency;

obtaining a preset waveform characteristic of a pulse charging waveform, wherein the waveform characteristic comprises a ratio range of an area of a positive pulse waveform to an area of a negative pulse waveform in each pulse cycle of the pulse charging waveform, an upper limit of the ratio range is 10 and a lower limit of the ratio range is 1;

generating a charging request according to the pulse charging frequency and the waveform characteristic; and transmitting the charging request to a charging device.

14. The readable storage medium according to claim 13, wherein a frequency range of the pulse charging frequency in the pre-calibrated corresponding relationship is: 200 Hz-1500 Hz.

15. The readable storage medium according to claim 13, before the determining a pulse charging frequency according to the battery temperature, the battery state of charge and a pre-calibrated corresponding relationship, the charging control method further comprises:

determining whether the battery temperature is in a preset temperature range;

the determining a pulse charging frequency according to the battery temperature, the battery state of charge and a pre-calibrated corresponding relationship comprises:

when determining that the battery temperature is in the preset temperature range, determining the pulse charging frequency according to the battery temperature, the battery state of charge and the pre-calibrated corresponding relationship.

16. The readable storage medium according to claim 13, wherein the waveform characteristic further comprises a preset current peak of the positive pulse waveform corresponding to the battery temperature and the state of charge, and a preset current peak of the negative pulse waveform corresponding to the battery temperature and the state of charge, and the current peak of the negative pulse waveform is greater than the current peak of the positive pulse waveform.

17. The readable storage medium according to claim 16, wherein the waveform characteristic further comprises a positive pulse waveform characteristic, the positive pulse waveform characteristic is represented as $$\int_{t1}^{t2} F(t) \geq \frac{I_{max+} * (t2 - t1)}{2};$$

wherein F(t) represents the positive pulse waveform, $\int_{t1}^{t2} F(t)$ is the area of the positive pulse waveform, t1 is a starting time of the positive pulse waveform, t2 is an ending time of the positive pulse waveform and $I_{max+}$ is a current peak of the positive pulse waveform.

18. The readable storage medium according to claim 16, wherein a battery voltage corresponding to the current peak of the positive pulse waveform is smaller than a pre-calibrated charging cutoff voltage, and the charging cutoff voltage is a decomposition voltage of a battery electrolyte or a breakdown voltage value of a battery separator.

* * * * *